(12) United States Patent
Busse et al.

(10) Patent No.: US 6,215,641 B1
(45) Date of Patent: Apr. 10, 2001

(54) ELECTROSTATIC DEVICE FOR SUPPORTING WAFERS AND OTHER COMPONENTS FOR USE AT TEMPERATURES OF UP TO 230° C.

(75) Inventors: Karl-Hermann Busse, Wilnsdorf; Joachim Arit, Netphen, both of (DE)

(73) Assignee: VenTec Gesellschaft für Venturekapital und Unternehmensberatung, Siegen (DE)

( * ) Notice: Subject to any disclaimer, the term of this patent is extended or adjusted under 35 U.S.C. 154(b) by 0 days.

(21) Appl. No.: 09/262,611

(22) Filed: Mar. 4, 1999

(30) Foreign Application Priority Data

Mar. 6, 1998 (EP) .................................................. 98104034

(51) Int. Cl.$^7$ .................................................. H02N 13/00
(52) U.S. Cl. ............................................................ 361/234
(58) Field of Search .................................... 361/230–235; 279/128

(56) References Cited

U.S. PATENT DOCUMENTS

| | | | |
|---|---|---|---|
| 5,522,131 | * | 6/1996 | Steger ....................................... 29/829 |
| 5,606,485 | * | 2/1997 | Shamouilian et al. ................ 361/234 |
| 5,671,117 | * | 9/1997 | Sherstinsky et al. ................. 361/234 |
| 5,691,876 | * | 11/1997 | Chen et al. ............................ 361/234 |
| 5,745,311 | * | 4/1998 | Shamouilian et al. ................ 361/234 |
| 5,914,568 | * | 6/1999 | Nonaka ............................ 315/111.21 |

* cited by examiner

*Primary Examiner*—Michael J. Sherry
(74) *Attorney, Agent, or Firm*—Friedrich Kueffner (57) ABSTRACT

An electrostatic chuck for clamping an electrically conducting workpiece includes an electrode that is incorporated between two insulating layers of an organic material, preferably polyimide, and that is mounted, with or without a coating, on a metallic pedestal. An insulating intermediate layer, for example, in the form of an intermediate ring having a thickness equal to or up to 10% greater than the thickness of the electrode, provided for eliminating a gap at the edge of the electrostatic chuck.

24 Claims, 5 Drawing Sheets

ELECTROSTATIC DEVICE FOR SUPPORTING WAFERS AND OTHER COMPONENTS FOR USE AT TEMPERATURES OF UP TO 230° C.

BACKGROUND OF THE INVENTION

1. Field of the Invention

The present invention relates to an electrostatic chuck, in which preferably polyimide is used as the dielectric material and in which the resistance to plasma is increased by achieving a very flat surface, as well as an electrostatic chuck which, by virtue of careful pretreatment, production of a diffusion-permeable electrode and modification of the adhesive, can be used at temperatures up to 230° C. Furthermore, by partial modification of the dielectric constant of the material used as the dielectric, it is possible to adjust the force (clamping force) exerted on the substrate (wafer).

2. Description of the Related Art

A great deal of work has already been done on electrostatic chucks in which the electrode(s) (conductor(s)) connected to the voltage source) is (are) substantially insulated by an organic polymer.

Although the patent literature makes mention also of other polymers, it is mainly polyimide that is meant, because of the many advantages (plasma resistance, lack of particles, temperature stability, relatively high dielectric constant and high electrical breakdown strength) which it offers. A wide range of systems is proposed, but they all suffer from many disadvantages. In particular these systems have poor temperature stability.

Although individual organic polymers, in particular polyimide, are stable under vacuum and/or protective gas conditions up to temperatures of more than 400° C., the adhesives used to bond the electrodes, insulating layers and pedestal fail at much lower temperatures, mostly in the range of approximately 100 to 150° C.

The state of the art is described in particular in the following patents: U.S. Pat. No. 5,691,876 proposes an adhesiveless, electrostatic chuck for use at high temperatures; however, this chuck is extremely costly to manufacture.

With regard to the concept outlined in the aforementioned patent, it must be stated that, although under favorable conditions this electrostatic chuck can resist temperatures in the intended range from 200° C. to 400° C., given the residual moisture content that is normally present in polyimide foil (up to approx. 4% according to the data sheet provided by the DuPont company) the water vapor generated when the chuck is used at the aforementioned temperatures destroys any bond between a flat metal electrode, acting as a diffusion barrier, and polyimide and/or the pedestal.

U.S. Pat. No. 5,708,557 proposes increasing the puncture resistance of the insulating layer by using a fibre filling.

EP 0 693 771 B1, corresponding to U.S. Pat. No. 5,606, 485, describes a step between 1 and 10 μm high provided at the edge of the system in order to improve its resistance to erosion in the plasma.

U.S. Pat. No. 5,634,266 describes an electrostatic chuck in which an erosion-proof smooth surface is achieved by means of a recess provided in the pedestal.

U.S. Pat. No. 5,625,526 describes, among other things, a system in which an insulating polyimide film is produced from the solution.

U.S. Pat. No. 5,560,780 and EP 0 635 869 A1 describe a system in which an electrostatic chuck consisting of polyimide foils is protected by a layer of ceramic material.

EP 0 260 150 A2 describes an electrostatic chuck in which the outer insulating layer of the electrode is made from polyimide.

The following patents also refer to electrostatic chucks consisting at least partially of polyimide, but the chuck system itself, consisting of an organic dielectric and a metallic electrode, has not been significantly improved as regards temperature stability and plasma resistance.

U.S. Pat. No. 5,636,098 and EP 0 742 588A2 describe a system in which the electrostatic chuck is sealed off from the plasma by a barrier.

U.S. Pat. No. 5,486,975 describes a "protective ring" that protects the electrostatic chuck from the plasma.

EP 0 668 608 A1 describes the electrical connection of an electrostatic chuck.

EP 0 668 607 A1 describes a system in which the electrostatic chuck is improved by additionally supplying a protective gas at the edge of the system.

U.S. Pat. No. 5,528,451 describes an improved method of supplying power at the periphery of the system.

EP 0 805 487 A2 describes an electrostatic chuck in which the electrode is highly segmented. When one segment fails, it is disconnected from the power supply and the system continues to be operated with the other segments.

EP 0 734 052 A1 describes an electrostatic chuck that can be operated in both unipolar and bipolar mode.

In addition to the aforementioned system, U.S. Pat. No. 5,671,117 also embodies rear face cooling via a plurality of non-uniformly distributed gas supply holes.

U.S. Pat. No. 5,646,814 describes an electrostatic chuck in which two electrodes are integrated one over the other, one electrode being used to hold the system onto the pedestal, while the second electrode holds the substrate.

U.S. Pat. No. 5,631,803 describes an electrostatic chuck in which on top of the upper foil, which forms the insulating layer, there is mounted a second foil in which grooves are provided to serve as channels for distributing a cooling gas.

U.S. Pat. No. 5,460,684 describes an electrostatic chuck having a defined surface roughness. Polyimide is a possible choice of dielectric material.

U.S. Pat. No. 5,592,358 describes an electrostatic chuck in which a magnet is incorporated into the pedestal in order to achieve a more uniform plasma at the surface of the substrate.

U.S. Pat. No. 5,644,467 describes an electrostatic chuck having a thickened dielectric layer around the cooling gas inlets in order to increase the lifetime of the system. In the case of the spray-applied ceramic layers which are also described, instructions are also given on how this is accomplished, but no such explanation is given for the polyimide, which is also mentioned as a dielectric material.

U.S. Pat. No. 5,328,311 describes an electrostatic chuck in which the pedestal used is cooled by liquid nitrogen and its temperature is controlled by a heating system. The electrostatic chuck consists of polyimide, copper, polyimide.

U.S. Pat. No. 5,275,683 describes an electrostatic chuck in which the edge of the system is curved downwards.

U.S. Pat. No. 5,191,506 describes an electrostatic chuck consisting, among other things, of polyimide, copper, polyimide.

U.S. Pat. No. 5,255,153 describes an electrostatic chuck consisting, among other things, of polyimide, copper, polyimide.

U.S. Pat. No. 4,645,218 describes an electrostatic chuck consisting, among other things, of polyimide, copper, polyimide.

EP 0 467 390 A1 describes an electrostatic chuck in which a liquid-cooled pedestal is used. The electrostatic chuck consists of polyimide, copper, polyimide.

Electrostatic chucks having an organic dielectric (e.g. polyimide) exhibit three fundamental problems that limit the lifetime as well as the potential uses of such chucks. These problems are:
a) In a plasma environment the chucks have a much lower service life than, for example, ceramic systems. This can lead to early failure and thus to equipment downtime.
b) The chucks have a much lower temperature stability than, for example, ceramic systems.
c) In many cases, the temperature distribution of a substrate on the electrostatic chuck is insufficiently homogeneous.

SUMMARY OF THE INVENTION

The purpose of the invention is therefore to find means of increasing the temperature resistance and/or the plasma resistance of a preferably polyimide-based electrostatic chuck, also to be able to vary the clamping force per unit area, and to create a cost-effective system that is suitable for use in an apparatus operating at chuck surface temperatures of up to 230° C. and under relatively drastic plasma conditions (e.g. in "narrow gap" etching equipment).

In accordance with the present invention, an electrostatic chuck for clamping an electrically conducting workpiece includes an electrode that is incorporated between two insulating layers of an organic material, preferably polyimide, and that is mounted with or without a coating, on a metallic or non-metallic pedestal.

BRIEF DESCRIPTION OF THE DRAWING

In the drawing:

FIG. 3b is a cross section taken along sectional lines A—A or B—B in FIG. 3a;

FIG. 6b is a sectional view taken along sectional line A—A of FIG. 6a.

DESCRIPTION OF THE PREFERRED EMBODIMENTS

Figure 1:
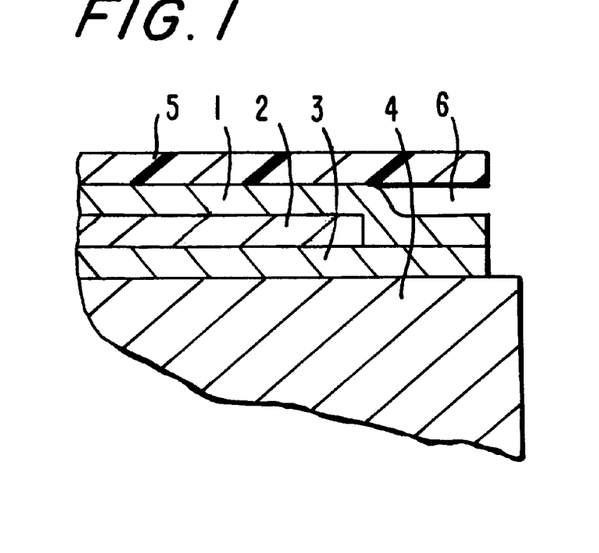
FIG. 1 is a cross-section of the edge zone of an electrostatic chuck according to the prior art.

FIG. 1 depicts a cross section through the edge zone of a current state-of-the-art electrostatic chuck, with a substrate (wafer). In this drawing (1) denotes the upper dielectric layer, (2) the electrode, (3) the lower dielectric layer, (4) the pedestal, (5) the substrate, and (6) the gap formed by pressing the upper dielectric layer onto the system, in which gap a plasma may attack or break through.

Figure 2:
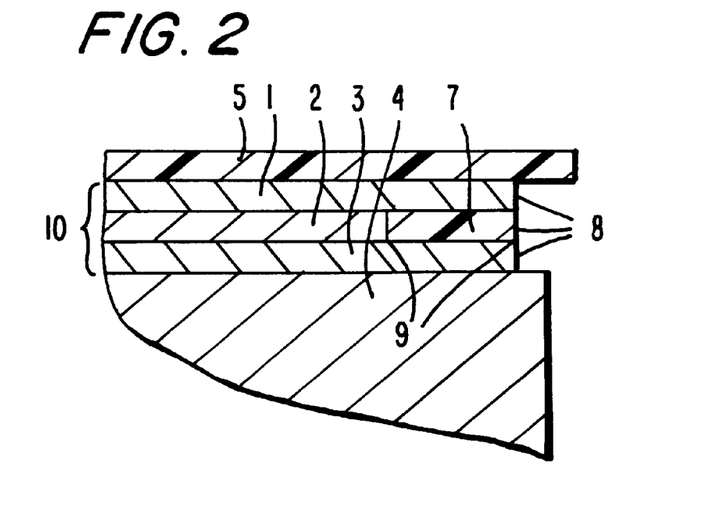
FIG. 2 is a cross-section of the edge zone of an electrostatic chuck according to a first embodiment of the invention.

FIG. 2 depicts a cross section through the edge zone of an electrostatic chuck according to the first part of this invention, wherein (1) denotes the upper dielectric layer, (2) the electrode, (3) the lower dielectric layer, (4) the pedestal, (5) the substrate, (7) the intermediate layer for compensating for the height of the electrode, (8) the outer edge of the dielectric structure, which is the only place at which the plasma can attack according to this invention, (9) the width of the intermediate layer, i.e. the width of the material that must be removed in this invention before the plasma breaks through to the electrode, and (10) the entire electrostatic chuck system.

Figure 3A:
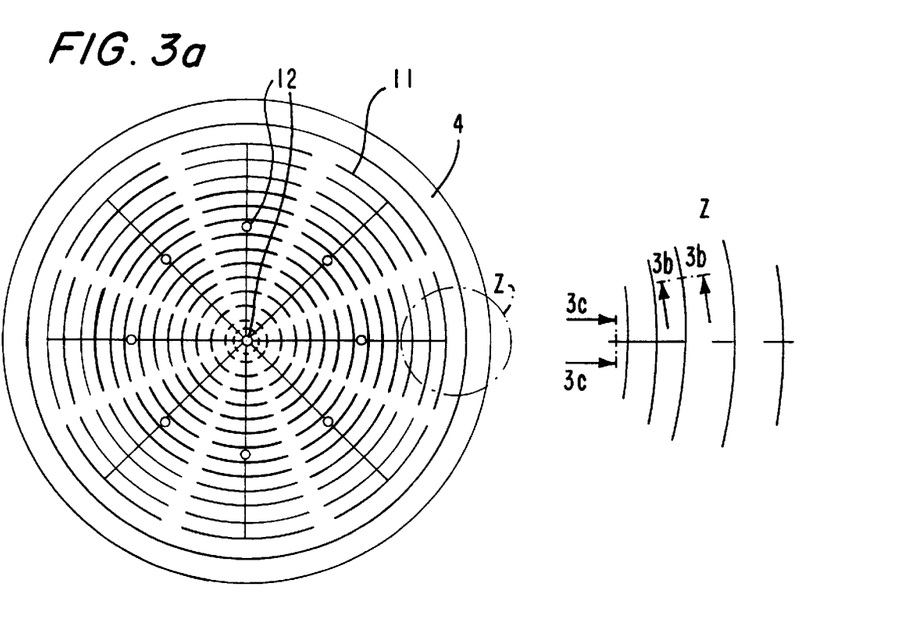
FIG. 3a is a top view of the electrostatic chuck according to the second embodiment of the invention.

FIG. 3a depicts a top view, with detail Z, of a unipolar configuration of an electrostatic chuck according to the second part of this invention, wherein (4) denotes the pedestal, (11) the passageway for the cooling gas and (12) the location of the inlet point(s) for the cooling gas.

Figure 3B:
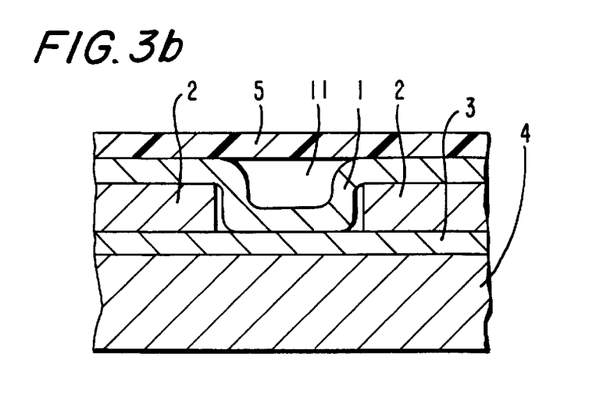

FIG. 3b depicts a cross section A—A or B—B in detail Z of FIG. 3a, wherein (1) is the upper dielectric layer, (2) the electrode, (3) the lower dielectric layer, (4) the pedestal, (5) the substrate and (11) the passageway for the cooling gas.

Figure 3C:
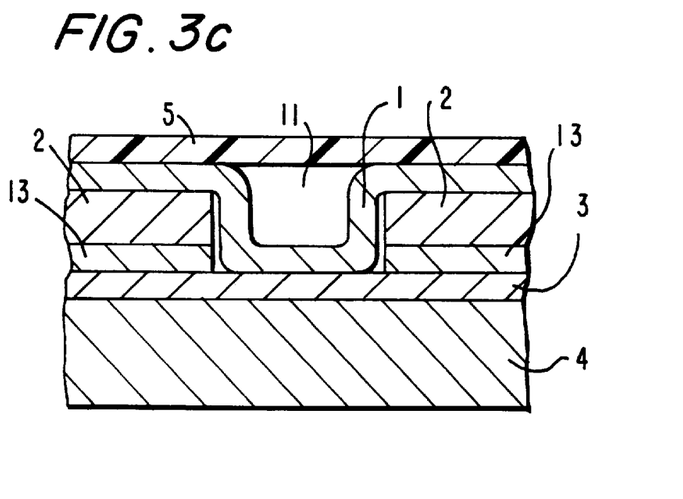
FIG. 3c is a cross-sectional view taken along sectional lines A—A or B—B in FIG. 3a including a lower intermediate layer.

FIG. 3c depicts a section A—A or B—B in detail Z of FIG. 3a, wherein an additional, lower intermediate layer (13) is used. (1) denotes the upper dielectric layer, (2) the electrode, (3) the lower dielectric layer, (4) the pedestal, (5) the substrate, (11) the passageway for the cooling gas and (13) the additional, lower intermediate layer for increasing the depth of the cooling gas passageway (11).

Figure 4:
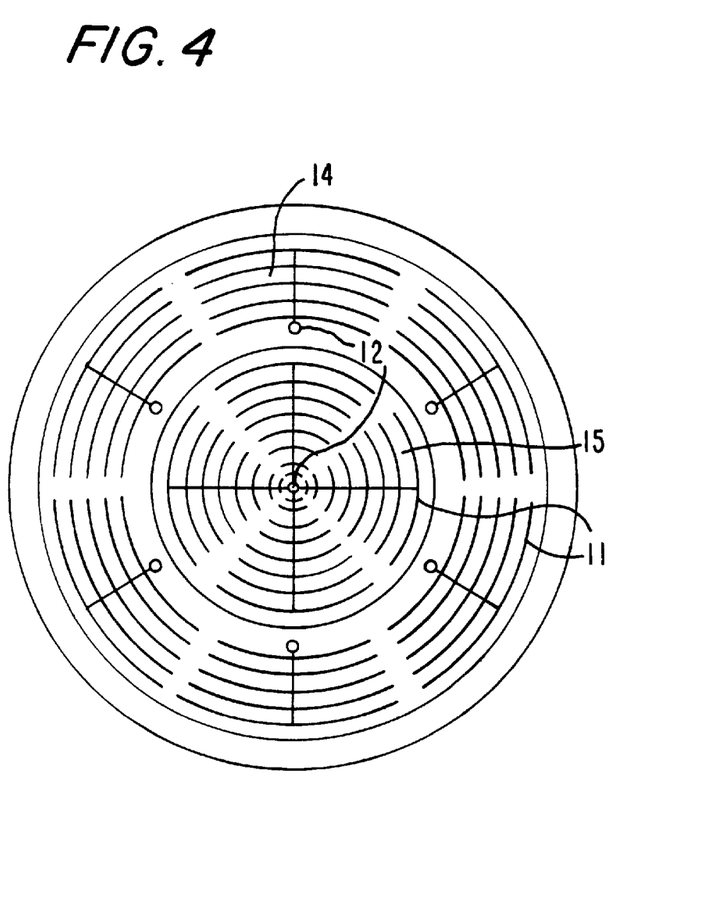
FIG. 4 is a top view of a second embodiment of the electrostatic chuck according to the invention.

FIG. 4 depicts a bipolar embodiment of an electrostatic chuck according to the second part of this invention, wherein (11) is a cooling gas passageway and (12) denotes the position of the inlets for the cooling gas, (14) is the first and (15) the second electrode of the electrostatic chuck.

Figure 5:
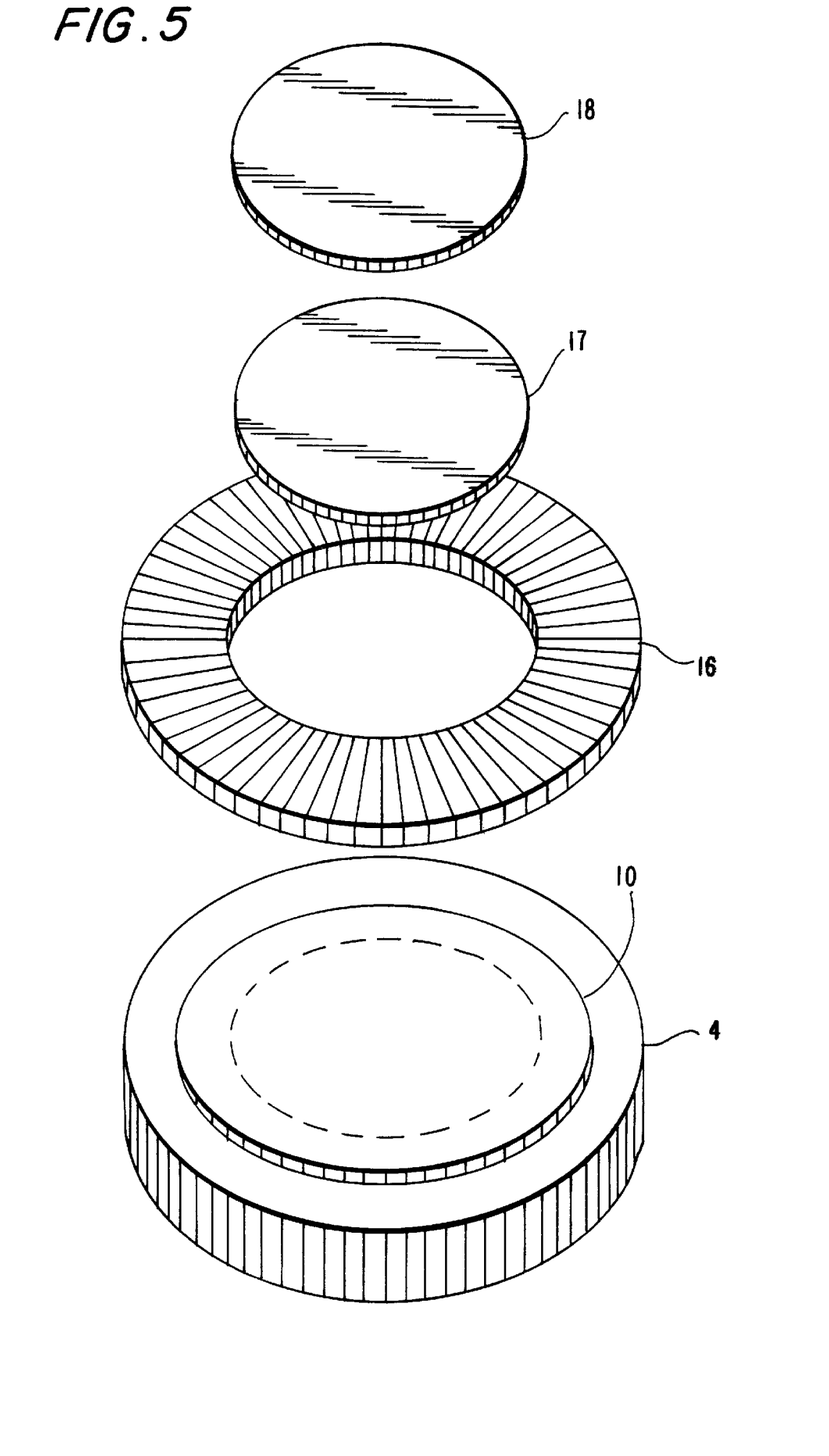
FIG. 5 is an exploded perspective view of a device for pressing an electrostatic chuck onto a pedestal.

FIG. 5 depicts a device for pressing an electrostatic chuck onto a pedestal, without a step in the edge zone, combined with a structured electrode. In this Figure (4) denotes the pedestal, (10) the electrostatic chuck, (16) the flat, polished ring, (17) the pressure-compensating foil and (18) the polished disc.

Figure 6A:
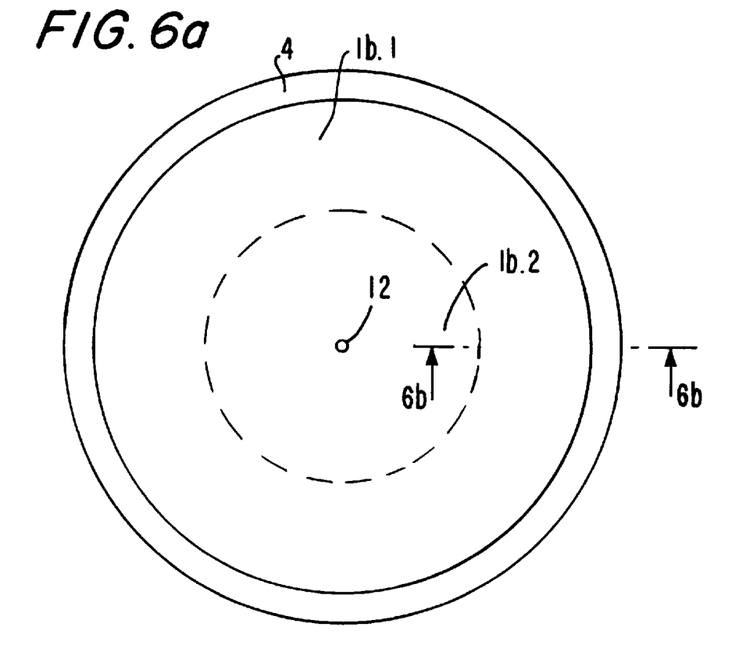
FIG. 6a is a top view of a third embodiment of the electrostatic chuck according to the present invention.

FIG. 6a depicts a proposal according to Part III of the invention for an electrostatic chuck in which the upper dielectric structure consists of foils having different dielectric constants. Foil (1b.1) is filled with a finely dispersed ceramic material and foil (1b.2) is unfilled, (4) is the pedestal and (12) the inlet for the cooling gas.

Figure 6B:
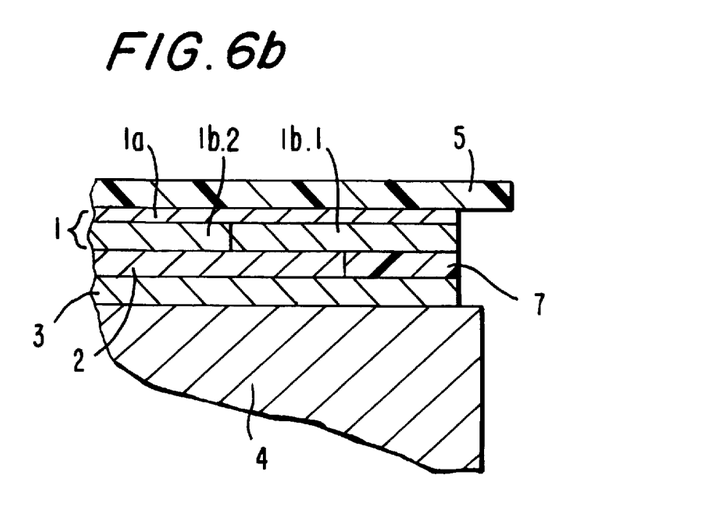

FIG. 6b depicts the section A—A shown in FIG. 6a through the edge zone of an electrostatic chuck. In this Figure (1a) is the unfilled covering foil of the upper dielectric structure (1), and (1b.1) is the filled second layer of the upper dielectric structure (1); (1b.2) is the unfilled second layer of the upper dielectric structure, (2) the electrode, (3) the lower dielectric layer, (4) the pedestal, (5) the substrate and (7) the intermediate layer to compensate for the height of the electrode.

Under drastic plasma conditions, it is extremely important that the plasma cannot have any effect on the organic dielectric material.

Theoretically, this is the case because the dielectric material is covered by the substrate (wafer) (FIG. 1). However, in the state-of-the-art systems, a gap (6) inevitably forms between the substrate (5) and the upper dielectric layer (1) and, under unfavorable conditions, the plasma may ignite in the said gap and destroy the dielectric layer (1). This gap ((6)

in FIG. 1) is formed because, at the edge of the system, the covering foil (upper dielectric layer (1) in FIG. 1) must also be extended over the electrode (2) in order to insulate this edge zone.

If this gap (6) can be avoided, the plasma can only attack the outer edge of the dielectric layer. Given a normal thickness of 30 to 150 μm for the upper dielectric layer (1) and a normal edge width of, for example, 2000 to 3000 μm (equal to the width of the intermediate layer (9) in FIG. 2), a large amount of plastic material must be destroyed before the dielectric layer is destroyed to the extent that a conducting connection is formed between the plasma and the electrode (2).

In our invention (see FIG. 2) this is accomplished by inserting an intermediate layer (7) of organic insulating material (e.g. polyimide with or without adhesive) between the upper dielectric layer (1) and the lower dielectric layer (3).

The intermediate layer may also be inserted if it is necessary to provide passageways in the central area of the electrostatic chuck in order to distribute a gas for improving the heat transfer between pedestal (4) and substrate (5).

The foregoing considerations can be combined into the requirement that the entire face of the electrostatic chuck ((10) in FIG. 2) facing the substrate should be as flat as possible. In this connect ion, the smoothness at the outer periphery of the dielectric structure (8) of the electrostatic system ((10) in FIG. 2) is also decisive in determining the plasma resistance.

Good flatness of the entire surface of the electrostatic chuck ((10) in FIG. 2) facing the substrate leads to a uniformly high clamping force and thus to good contact between the electrostatic chuck ((10) in FIG. 2) and the substrate (5). In addition, this also achieves uniform heat transfer between the electrostatic chuck ((10) in FIG. 2 ) and the substrate (5). Also, good flatness of the entire surface of the electrostatic chuck ((10) in FIG. 2) facing the substrate minimizes the amount of cooling gas flowing out at the edge of the electrostatic chuck, if such a gas is used.

For manufacturing a system having the desired flatness, the basis is a foil of organic dielectric material (usually polyimide, lower dielectric layer ((3) in FIG. 2)) to which is applied, with or without an adhesive, an electrically conducting electrode (2) consisting of metal, usually copper, or of a polymer that is electrically conducting or has been made electrically conducting (e.g. by filling it with a finely dispersed metal or conductive carbon).

The length and width of the base foil, manufactured from the lower dielectric layer (3) and the conducting electrode (2), is overall much larger than the later electrostatic system ((10) in FIG. 2). In the next step, immovable alignment marks are provided, outside the dimensions of the final electrostatic system ((10) in FIG. 2), in the outer region of the base foil produced in this way.

By providing openings in the upper dielectric layer (1), the electrode (2) and the lower dielectric layer (3) it is also possible to produce gas passageways. If the edge zone of these gas passageways (area between the edge of the electrode (2) and the edge of the upper (1) and lower (3) dielectric layer) is to be formed by an intermediate layer (7) as shown in FIG. 2, further alignment marks should be provided in the later completely cut away area of the gas passageway.

In the next step, the conductive side of the base foil (future electrode (2)) that has been produced must be structured by, for example, wet or dry etching. For the intermediate layer (7), another foil consisting of a dielectric material (preferably polyimide), up to about 10% thicker (including adhesive), is provided with alignment marks. These marks must line up with the marks on the base foil.

The outer contour of the conductive side of the base foil is formed in this intermediate layer ((7) in FIG. 2), for example by means of stamping, milling or etching. The intermediate layer (7) can have the form of an outer ring (intermediate ring) and/or it may have the structure of the electrode, as shown for example in FIG. 3a.

The intermediate layer(s) (7) is (are) positioned precisely on the base foil, in accordance with the alignment marks.

Depending on the properties of the adhesives used, a pressure of 10 to 1000 kN is applied uniaxially to this foil system at a temperature of 50 to 200° C. in order to tack the foils together.

Next, a covering foil (upper dielectric layer (1) in FIG. 2) is tacked to this foil system under similar processing conditions.

Then, an adhesive is applied to the back (the side of the lower dielectric layer (3) facing the pedestal (4) in FIG. 2) of the foil system which has been produced by the tacking operations.

The outer edge of the dielectric structure ((8) in FIG. 2), and if necessary also the inner structure (passageways to distribute a cooling gas) of the electrostatic chuck is (are) produced by, for example, milling, punching or etching.

Next, the completed electrostatic chuck ((10) in FIG. 2) is mounted on the pedestal (4) in a press at a uniaxial pressure of 10 to 2000 kN and a temperature of 100 to approximately 350° C. For this operation, the pressure and/or the processing temperature are set significantly higher than for the preceding bonding operations.

In order to achieve an electrostatic system ((10) in FIG. 2) with a very flat surface, the pressing is carried out against a flat, polished and very hard surface (e.g. ground, hardened steel).

The following procedure is necessary in order to achieve an electrostatic chuck with high temperature stability. Normally, polyimide has a moisture content of up to 4%. Thermosetting adhesives may contain moisture and residual solvent. When the adhesive sets, it is possible that other volatile compounds might form. The higher the temperature, the sooner these volatile compounds lead to delamination of the adhesive bonds, if they can not escape from the system; this is because, on the one hand, the vapor pressure of the bonds increases and, on the other hand, the peel strength of the bonds decreases greatly with rising temperature. One first important measure to reduce the risk of delamination is to dry the polyimide foils and the pedestal at elevated temperature in a vacuum after each manufacturing step (e.g. 0.5 to 8 hours at 60 to 240° C. and a pressure of more than 10 hPa). Our tests have shown that this increases the temperature resistance of a polyimide-based electrostatic chuck, using for example epoxy-based adhesives, by 30 to 50° C. It is above all important to carry out the drying step directly before pressing the electrostatic chuck onto the pedestal, when solid, flat metal electrodes of the kind contained in state-of-the-art electrostatic chucks are used. These act as extremely effective diffusion barriers and considerably increase the risk of delamination, because the foils or the adhesive often s till contain volatile compounds.

According to the laws of diffusion, the amount of substance escaping from a system decreases disproportionately with distance. If, therefore, in the case of electrostatic chucks in which the lower dielectric layer (3) is manufactured from polyimide or some other dielectric material containing volatile components, it is frequently impossible to eliminate a residual content of said volatile components, the latter must be given the chance to escape by the shortest possible route.

However, the shortest path is perpendicular to the surface of the electrostatic chuck ((10) in FIG. 2). This requires an electrode (2) that does not act as a diffusion barrier.

In this part of the invention, we therefore use diffusion-permeable electrodes ((2) in FIG. 2) based on intrinsically conductive organic polymers or polymers which have been rendered conductive by the addition of a finely dispersed metal or conductive carbon.

The second possible method is to segment the electrode (2) by interposing narrow gaps (0.3 to 8 mm wide) so that short diffusion paths are achieved.

This design has nothing to do with an electrostatic chuck for non-conductive substrates (a so-called I.D.E. electrostatic chuck), in which the adjacent electrodes are at different potentials, whereas in our system they are substantially at the same potential.

Because of the narrow gaps, it is not possible nor even desirable here to provide openings in the upper dielectric layer ((1) in FIG. 2) in the area of the gaps, as was done in the solution described above. FIGS. 3a, 3b and 3c show one of the many possible configurations of a unipolar electrostatic chuck system and FIG. 4 shows a configuration for a bipolar electrostatic chuck system.

Because of the plurality of gaps incorporated into the electrode ((2) in FIGS. 3a, 3b and 3c), it is logical also to make use of them to distribute a cooling gas.

For this purpose, when the foil system is pressed onto the pedestal (4), a pressure-compensating foil is used which results in depressions being formed in the surface of the elastic covering foil where openings are provided in the electrode ((2) in FIG. 2), for example as a result of the structuring of the electrode ((2) in FIG. 2) described in Part I of this document These depressions (cooling gas passageways (11) in FIGS. 3a and 3b) are slightly narrower than the openings in the electrode (2) and may be almost exactly as deep as the electrode (2) is thick.

If the cross section of the cooling gas passageways ((11) in FIG. 3b) is inadequate to permit the distribution of a cooling gas, an additional, lower intermediate layer ((13) in FIG. 3c), preferably made of polyimide, can be placed beneath the electrode (2). In the area of the cooling gas passageways (11), this additional, lower intermediate layer ((13) in FIG. 3c) conforms to the rear geometry of the electrode (2) and extends to the outer edge of the dielectric structure ((8) in FIG. 2). The depth of the cooling gas passageways ((11) in FIG. 3c) is then enlarged by the thickness of the additional, lower intermediate layer ((13) in FIG. 3c).

The edge zone of the aforementioned embodiment of an electrostatic chuck system can be designed without a step, as described above and in FIG. 2. This is done by using a ring ((16) in FIG. 5) to cover the outer area of the electrostatic chuck when pressure is applied (the ring is approximately twice as wide as the intermediate layer (7) in FIG. 2). The inner area of the ring, and thus also of the electrostatic chuck, is pressed against a pressure-compensating foil ((17) in FIG. 5). This must be backed by a hard, flat, polished disc of, for example, hardened steel ((18) in FIG. 5), so that the thickness of the system (consisting of the disc (18) plus the pressure-compensating foil (17)) is several per cent thicker than the ring (16) against which the edge zone of the electrostatic chuck ((10) in FIG. 5) is pressed.

These procedures according to the second method permit a considerable reduction of the risk of delamination occurring in the bonds used.

A thermally reacting epoxy resin may now be used up to an operating temperature of 175° C. for the electrostatic chuck, without the adhesive bonds failing. This epoxy adhesive must be modified for higher temperatures; as our studies have shown, this can be done by adding a nitrile component to the adhesive. Despite the generally lower peel strength, the durability of an adhesive system modified in this way is more than adequate under the aforementioned conditions up to 230° C.

In order to achieve more homogeneous temperature distribution in a substrate (e.g. a wafer) on an electrostatic chuck by suitably distributing a cooling gas on the reverse side of the substrate, it is technically and economically advantageous for the clamping force not to be always constant over the entire surface of the electrostatic chuck. In certain areas, for example at the edge of the system, the electrostatic clamping force should be larger per unit area, without requiring a separate partial electrode, or several such electrodes, with its (their) own separate power supply (supplies). This can be advantageous in terms of cost, because the design and manufacture of such an electrostatic chuck is simple and it can be operated without modifying the existing power supply. This embodiment of the invention can also be used to flatten out a substrate that has been distorted in a high-temperature process.

Many documents cite as an advantage of ceramic-based electrostatic chucks the fact that the dielectric constant of a ceramic material is far higher than that of plastics (3.5 in the case of polyimide and up to far over 1000 in the case of ceramics), and thus a higher clamping force (or a lower operating voltage) can be achieved. However, in most cases this advantage is not relevant in practice because, although the breakdown strengths are theoretically similar, real ceramics have far more defects, such as pores, micro-cracks and inclusions, which reduce the breakdown strength, than do organic foils. These typical defects of ceramics make it necessary in practice to use very thick ceramic layers in electrostatic chuck systems, compared with foils made of organic polymer (including polyimide) foils. On the other hand, at the present point in time, it is a very expensive and technically complex process to produce defect-free ceramic materials, and this leads to very high costs for such an electrostatic chuck system. In contrast, almost defect-free foils made of organic polymers, down to a thickness of far less than 10 $\mu$m, are available at low price. However, if a material having a high dielectric constant is suspended in dissolved thermoplastic polyimide, and if foils are produced from this material, it is possible even at relatively low contents of ceramic filler to obtain a significant increase in the dielectric constant. The following are examples of suitable fillers: titanium dioxide, aluminium oxide, or an alkali titanate or alkaline-earth titanate that may be modified also with rare earths to further increase the dielectric constant. The ceramic material should possess a uniform, fine granular structure (less than 1 $\mu$m is desirable).

The procedure described above offers the following advantages: On the one hand, while the electrostatic chuck exerts the same clamping force, the foil thickness can be increased and the plasma resistance is significantly boosted. Theoretically, a fourfold dielectric constant permits twice the foil thickness. On the other hand, even at the same foil thickness, a higher clamping force compared with an unfilled foil can be achieved in the case of substrates and pedestals of relatively small diameter.

A further application is a divided, upper dielectric structure (for example, as shown in FIG. 6a). Since, for a given thickness of the upper dielectric structure ((1) in FIG. 2) and an applied voltage, the clamping force of an electrostatic chuck depends linearly on the dielectric constant, a ceramic-filled foil may be used in areas where increased clamping force is required (for example, at the edge of the electrostatic chuck). We suggest the following procedure for obtaining a flat surface: The filled ((1b.1) in FIGS. 6a and 6b) and non-filled ((1b.2 in FIGS. 6a and 6b) sections of foil (thickness of the foils (1b.2) and (1b.1) respectively=$\frac{2}{3}$ to $\frac{3}{4}$ of the total upper dielectric structure) are bonded in an exact fit onto a thin foil (preferably polyimide; (1a) in FIG. 6b), which will later form the surface of the electrostatic chuck system facing the substrate (thickness of the foil (1a) typically $\frac{1}{3}$ to $\frac{1}{4}$ of the total thickness of the upper dielectric structure (1) in FIG. 6b). The upper dielectric structure (1) prepared in this way (said structure now consisting of the foils (1a), (1b.1) and (1b.2) in FIG. 6b) is placed on the electrode ((2) in FIG. 6b) and then, depending on the requirements, the entire electrostatic chuck ((10) in FIG. 2) is pressed either against a flat, hard, polished plate or against a pressure-compensating foil.

It is also possible to replace the filled foil ((1b.1) in FIGS. 6a and 6b) by a ceramic layer or a ceramic coating of the foil ((1a) in FIG. 6b).

What is claimed is:

1. An electrostatic chuck for clamping an electrically conducting workpiece, the electrostatic chuck comprising an electrode mounted between two insulating layers of an organic material, and mounted on a metallic pedestal, further comprising an insulating intermediate layer, in the form of an intermediate ring having a thickness equal to or 10% greater than a thickness of the electrode, mounted for eliminating a gap at an edge of the electrostatic chuck.

2. The electrostatic chuck according to claim 1, wherein the organic material is polyimide.

3. The electrostatic chuck according to claim 1, wherein the organic material has a coating.

4. The electrostatic chuck according to claim 1, wherein the electrostatic chuck has an upper surface with maximum flatness obtained by pressing the chuck against a flat, hard and polished plate.

5. The electrostatic chuck according to claim 1, wherein the electrode has interruptions at regular and/or irregular intervals with regular and/or irregular gaps.

6. The electrostatic chuck according to claim 5, wherein the intervals are 1 to 15 millimeters and the gaps are 0.3 to 8 millimeters.

7. The electrostatic chuck according to claim 5, wherein partial surfaces of the electrode created by the gaps are at the same potential and are conductively connected inside or outside the electrode.

8. The electrostatic chuck according to claim 1, wherein the electrode is comprised of an intrinsically conductive polymer.

9. The electrostatic chuck according to claim 1, wherein the electrode is comprised of an organic material rendered conductive by a filling of finely dispersed metal or conductive carbon.

10. The electrostatic chuck according to claim 1, wherein the thickness of the electrode is 5 to 500 $\mu$m.

11. The electrostatic chuck according to claim 10, wherein the thickness of the electrode is 10 to 70 $\mu$m.

12. The electrostatic chuck according to claim 1, wherein the two insulating layers include an upper dielectric layer, the electrostatic chuck having a surface, wherein the upper dielectric layer extends unbroken over the surface of the electrostatic chuck, except at points for supplying cooling gas and for a device for raising the pedestal.

13. The electrostatic chuck according to claim 1, wherein the two insulating layers include a lower dielectric layer, the electrostatic chuck having a surface, wherein the lower dielectric layer extends unbroken over the surface of the electrostatic chuck, except at points for supplying cooling gas and for a device for raising the pedestal.

14. The electrostatic chuck according to claim 1, wherein the electrostatic chuck has a unipolar configuration.

15. The electrostatic chuck according to claim 1, wherein the electrostatic chuck ha s a bipolar configuration.

16. The electrostatic chuck according to claim 1, wherein at least one of the two insulating layers of organic material comprises at least one layer of foil, wherein, for increasing the dielectric constant, the at least one layer of foil is filled with a filling material having a higher dielectric constant than the organic material, wherein the filling material is selected from the group consisting of titanium dioxide, aluminum oxide, alkaline titanate, alkaline-earth titanate and alkaline-earth titanate modified with rare earths.

17. The electrostatic chuck according to claim 16, wherein the at least one foil filled with filling material is comprised of a raw material produced by mixing a dissolved thermoplastic polyimide or other soluble organic polymer with the filler material and processing into a foil by pouring or stretching.

18. The electrostatic chuck according to claim 12, wherein the upper dielectric layer is comprised of at least two foil layers, wherein an upper of the insulating foils consists of one piece, and at least one lower of the insulating foils is composed of several sections having different dielectric constants.

19. The electrostatic chuck according to claim 1, wherein the insulating layers have ceramic coatings.

20. The electrostatic chuck according to claim 1, comprising a nitryl-modified, thermally reacting epoxy adhesive for bonding between the insulating layers and the electrode, the pedestal and the intermediate layer, whereby the electrostatic chuck is stable at temperatures of up to 230° C.

21. The electrostatic chuck according to claim 1, wherein the insulating layers, the electrode and the pedestal are dried at temperatures of 60 to 240° C. in a vacuum before or after fitting the insulating layers, the electrode and the pedestal to form the electrostatic chuck.

22. The electrostatic chuck according to claim 5, wherein a pressure-compensating foil is mounted on the electrostatic chuck in a press at temperatures between 100 and 350° C. and pressures of 10 to 2,000 kN, wherein the pressure-compensating foil is plastic at temperatures of between 100 and 350° C., such that, after pressing is completed, the gaps are visible on a surface of the electrostatic chuck facing a substrate.

23. The electrostatic chuck according to claim 22, wherein the gaps are configured to distribute a gas between the substrate and the electrostatic chuck.

24. The electrostatic chuck according to claim 22, wherein the gaps have a depths increased by backing the electrode with an additional layer of foil.

* * * * *

UNITED STATES PATENT AND TRADEMARK OFFICE
CERTIFICATE OF CORRECTION

PATENT NO.   : 6,215,641 B1
DATED        : April 10, 2001
INVENTOR(S)  : Karl-Hermann Busse et al.

Page 1 of 1

It is certified that error appears in the above-identified patent and that said Letters Patent is hereby corrected as shown below:

<u>Title page,</u>
Item [75], should read as follows: [75] Inventors: Karl-Hermann Busse, Wilnsdorf; Joachim Arlt, Netphen, both of (DE)

Signed and Sealed this

First Day of January, 2002

Attest:

JAMES E. ROGAN
*Attesting Officer*          *Director of the United States Patent and Trademark Office*